(12) United States Patent
Watanabe

(10) Patent No.: US 11,664,768 B2
(45) Date of Patent: May 30, 2023

(54) AMPLIFICATION CIRCUIT

(71) Applicant: Murata Manufacturing Co., Ltd., Kyoto (JP)

(72) Inventor: Daisuke Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/325,350

(22) Filed: May 20, 2021

(65) Prior Publication Data

US 2021/0273613 A1 Sep. 2, 2021

Related U.S. Application Data

(63) Continuation of application No. 16/367,750, filed on Mar. 28, 2019, now Pat. No. 11,043,922.

(30) Foreign Application Priority Data

Mar. 30, 2018 (JP) .............................. JP2018-069489

(51) Int. Cl.
*H03F 1/22* (2006.01)
*H03F 1/02* (2006.01)
(Continued)

(52) U.S. Cl.
CPC .............. *H03F 1/22* (2013.01); *H03F 1/0205* (2013.01); *H03F 3/193* (2013.01); *H03F 3/245* (2013.01)

(58) Field of Classification Search
CPC .......... H03F 1/22; H03F 1/0205; H03F 1/086; H03F 1/223; H03F 1/565; H03F 3/193;
(Continued)

(56) References Cited

U.S. PATENT DOCUMENTS 6,400,227 B1 6/2002 Goldfarb et al.
7,646,252 B2 1/2010 Banba
(Continued)

FOREIGN PATENT DOCUMENTS

JP 555-047485 B 3/1980
JP H03-113904 A 5/1991
(Continued)

OTHER PUBLICATIONS

Korean Office action for 10-2019-0034921 dated Aug. 27, 2020.
Japanese Office action for 2018-069489 dated Sep. 8, 2020.

*Primary Examiner* — Hafizur Rahman
*Assistant Examiner* — Khiem D Nguyen
(74) *Attorney, Agent, or Firm* — Pearne & Gordon LLP

(57) ABSTRACT

An amplification circuit includes: a power supply terminal that is connected to a power supply; a first transistor that has a first source terminal, a first drain terminal, and a first gate terminal to which a high-frequency signal is inputted; a second transistor that has a second source terminal that is connected to the first drain terminal, a second drain terminal that outputs a high frequency signal, and a second gate terminal that is grounded; a capacitor that is serially arranged on a second path that connects the second gate terminal and the power supply terminal; and a switch that is serially arranged on a first path, which connects the second drain terminal and the power supply terminal, or the second path. The second drain terminal and the second gate terminal are connected to each other via the switch and the capacitor.

19 Claims, 10 Drawing Sheets

(51) Int. Cl.
*H03F 3/193* (2006.01)
*H03F 3/24* (2006.01)

(58) Field of Classification Search
CPC ... H03F 3/245; H03F 3/72; H03F 3/19; H03F 2200/451
USPC .......................................... 330/277, 296, 311
See application file for complete search history.

(56) References Cited

U.S. PATENT DOCUMENTS

| | | |
|---|---|---|
| 9,583,409 B2 | 2/2017 | Yokoyama et al. |
| 11,043,922 B2 * | 6/2021 | Watanabe ............... H03F 3/245 |
| 2001/0009390 A1 | 7/2001 | Kusachi |
| 2007/0296507 A1 | 12/2007 | Hamaguchi |
| 2008/0297259 A1 | 12/2008 | Mu |
| 2010/0226450 A1 | 9/2010 | Tanaka |
| 2013/0128779 A1 | 5/2013 | Murakami |
| 2014/0159766 A1 | 6/2014 | Fujita et al. |
| 2015/0070095 A1 | 3/2015 | Cabanillas et al. |
| 2015/0207475 A1 | 7/2015 | Roy et al. |
| 2018/0351514 A1 | 12/2018 | Oon et al. |

FOREIGN PATENT DOCUMENTS

| | | |
|---|---|---|
| JP | 2008-5160 A | 1/2008 |
| JP | 2008-178085 A | 7/2008 |
| JP | 2010-528545 A | 8/2010 |
| JP | 2012-99915 A | 5/2012 |
| JP | 2013-110588 A | 6/2013 |
| JP | 2016-530845 A | 9/2016 |
| WO | 2009/044643 A1 | 4/2009 |

\* cited by examiner

Tr ON (DURING AMPLIFICATION OPERATION)

Tr OFF (WHEN AMPLIFICATION OPERATION NOT BEING PERFORMED)

FIG. 10A  Tr ON (DURING AMPLIFICATION OPERATION)
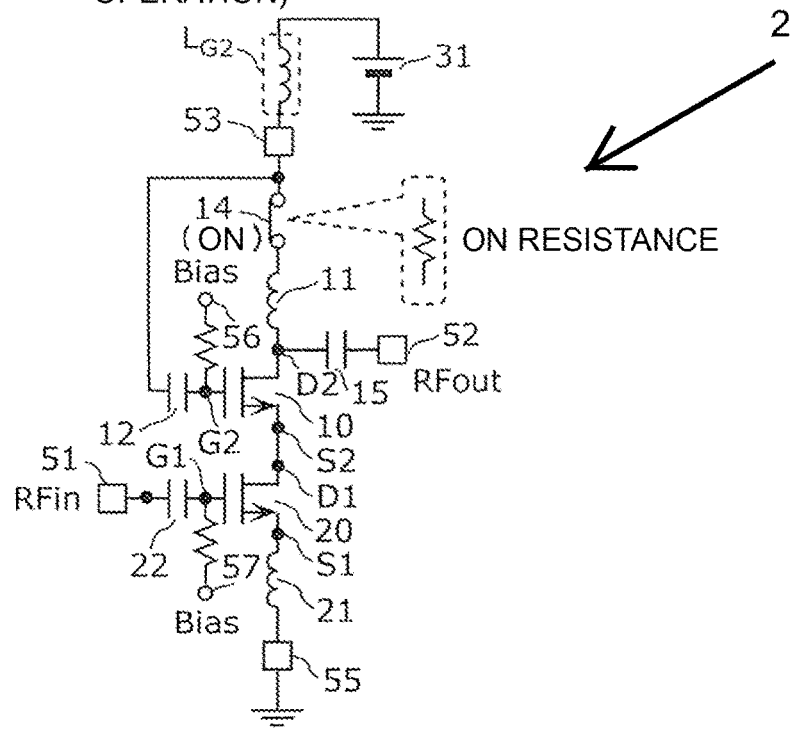
FIG. 10B  Tr OFF (WHEN AMPLIFICATION OPERATION NOT BEING PERFORMED)
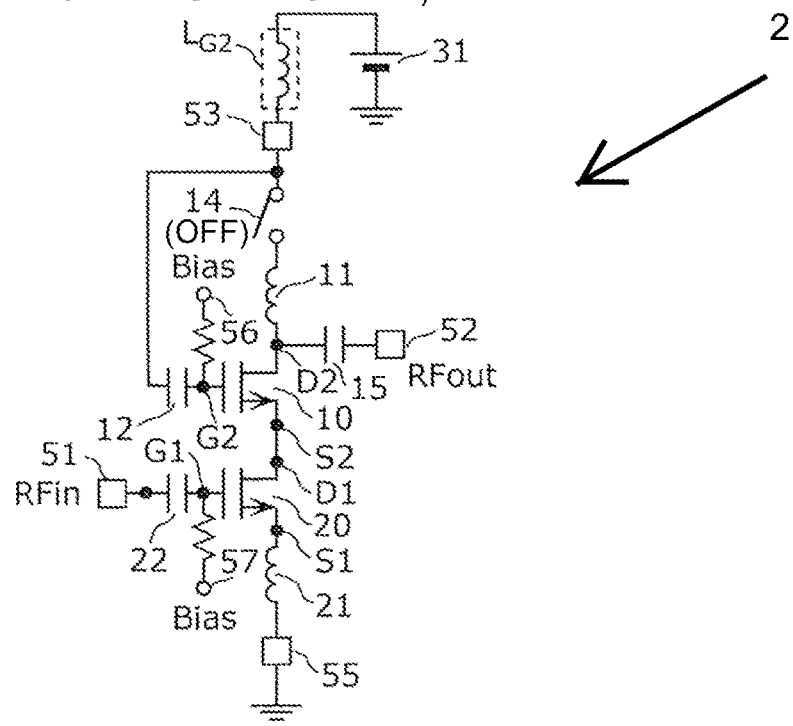

AMPLIFICATION CIRCUIT

This application is a continuation of U.S. patent application Ser. No. 16/367,750 filed on Mar. 28, 2019, which claims priority from Japanese Patent Application No. 2018-069489 filed on Mar. 30, 2018. The contents of these applications are incorporated herein by reference in their entireties.

BACKGROUND OF THE DISCLOSURE

1. Field of the Disclosure

The present disclosure relates to a cascode-connection amplification circuit.

2. Description of the Related Art

A cascode-connection amplification circuit is often used as a high-frequency signal amplification circuit.

Japanese Unexamined Patent Application Publication No. 2008-5160 discloses a cascode-connection amplification circuit that includes a first transistor and a second transistor. More specifically, the first transistor has a common emitter (or common source) and the second transistor has a common base (gate). In addition, whether or not a collector (drain) terminal of the first transistor is grounded can be switched using a switch.

However, in the cascode-connection amplification circuit disclosed in Japanese Unexamined Patent Application Publication No. 2008-5160, a parasitic inductance caused by a ground wiring line is added to the second transistor, which has a common base (gate), and as a result the grounding characteristic of the second transistor becomes unstable and the stability factor (K factor) of the cascode-connection amplification circuit is reduced. In this state, there is a risk that the amplification circuit will undergo oscillation when feedback occurs via a parasitic capacitance or the like in the vicinity of the transistor.

BRIEF SUMMARY OF THE DISCLOSURE

Accordingly, the present disclosure was made in order to solve the above-described problem and it is an object thereof to provide a stable cascode-connection amplification circuit in which oscillation is prevented.

In order to achieve this object, an amplification circuit according to a preferred embodiment of the present disclosure includes: an input terminal to which a high frequency signal is inputted; an output terminal that outputs the high frequency signal, which has been amplified; a power supply terminal that is connected to a power supply that generates a direct-current power supply voltage; a first transistor that has a first terminal, a second terminal, and a first control terminal to which a high frequency signal is inputted via the input terminal; a second transistor that has a third terminal that is connected to the second terminal, a fourth terminal that outputs an amplified high frequency signal, and a second control terminal that is grounded, the second transistor being cascode connected to the first transistor; a first capacitance element that is serially arranged on a second path that connects the second control terminal and the power supply terminal; and a first resistive element that is serially arranged on a first path that connects the fourth terminal and the power supply terminal or is serially arranged on the second path; the fourth terminal and the second control terminal being connected to each other via the first resistive element and the first capacitance element.

Although the second control terminal of the second transistor is grounded, a parasitic inductance component is generated at the second control terminal due to for example a wiring line that is for grounding the second control terminal. Therefore, in the amplification circuit of the related art, since the stability of the second transistor is reduced due to the potential of the second control terminal not being grounded in a fixed manner, feedback occurs, and an oscillation undesirably occurs when a loop formed by this feedback has a loop gain greater than or equal to 1.

With respect to this, in the above-described configuration, since the fourth terminal, which is an output terminal for a high-frequency signal, and the second control terminal are connected to each other via the first resistive element, a loop can be formed that does not have a loop gain greater than or equal to 1 due to the loop gain being reduced by the first resistive element. In addition, the potential of the second control terminal is isolated from the power supply potential by the first capacitance element arranged on the second path. Thus, even when a parasitic inductance component is generated at the second control terminal, the high-frequency feedback signal is attenuated, and therefore a stable amplification circuit in which oscillation is prevented can be provided.

In addition, the amplification circuit may further include: a first inductance element that is serially arranged on the first path that connects the fourth terminal and the power supply terminal; and a second capacitance element that is serially arranged between the fourth terminal and the output terminal; and the first resistive element may be serially arranged on the first path or the second path between the first inductance element and the second control terminal.

Due to this configuration, the first resistive element is arranged in a region outside the first transistor, the second transistor, and a matching network formed by the first inductance element and the second capacitance element, and therefore the degradation of the gain of the amplifier formed by the first transistor and the second transistor can be suppressed.

In addition, the first resistive element may be a first resistor and the first resistor may be serially arranged on just the second path out of the first path and the second path.

Due to this configuration, a current of the second transistor that flows along the first path is not attenuated by the first resistive element, and therefore the degradation of the amplification characteristics can be avoided.

Furthermore, the first resistive element may be a first switch, and the first switch may be serially arranged on the first path that connects the fourth terminal and the power supply terminal.

Due to this configuration, a so-called off leakage current that flows from the power supply terminal to the ground terminal via the fourth terminal, the third terminal, the second terminal, and the first terminal can be suppressed by putting the first switch into a non-conductive state when the first transistor and the second transistor are not operating.

In addition, when the amplification circuit is performing an amplification operation, the first switch may be in a conductive state, and when the amplification circuit is not performing an amplification operation, the first switch may be in a non-conductive state.

Due to this configuration, when the amplification circuit is performing an amplification operation, oscillation in the amplification circuit can be suppressed, and when the amplification circuit is not performing an amplification operation, the off leakage current of the amplification circuit can be suppressed.

The amplification circuit may further include: a second resistive element that is serially arranged on the first path or the second path, and is a second resistor or a second switch.

Due to this configuration, even in the case where the necessary resistance value is not secured using just the on resistance of the first switch when the first switch is in a conductive state, sufficient loop attenuation can be realized using the second resistive element.

In addition, the amplification circuit may further include: a third resistive element that is connected in parallel with the first inductance element.

Due to this configuration, even in the case where the necessary resistance value is not secured using just the on resistance of the first switch, sufficient loop attenuation can be realized using the third resistive element.

An amplification circuit according to another preferred embodiment of the present disclosure includes: an input terminal to which a high frequency signal is inputted; an output terminal that outputs the high frequency signal, which has been amplified; a power supply terminal that is connected to a power supply that generates a direct-current power supply voltage; a first transistor that has a first terminal, a second terminal, and a first control terminal to which a high frequency signal is inputted; a second transistor that has a third terminal that is connected to the second terminal, a fourth terminal that outputs an amplified high frequency signal, and a second control terminal, the second transistor being cascode connected to the first transistor; and a first resistive element that is serially arranged on a first path that connects the fourth terminal and the power supply terminal; the fourth terminal and the second control terminal being connected to each other via the first resistive element.

In the case where the second control terminal of the second transistor is set to the direct-current power supply voltage of the power supply, a parasitic inductance component is generated at the second control terminal of the second transistor due to for example a wiring line that is for connecting the power supply terminal and the power supply to each other. Therefore, the potential of the second control terminal becomes unstable with respect to high frequencies, feedback occurs, and an oscillation undesirably occurs when the loop formed by the feedback has a loop gain greater than or equal to 1.

With respect to this, in the above-described configuration, since the fourth terminal, which is an output terminal for a high-frequency signal, and the second control terminal are connected to each other via the first resistive element, a loop can be formed that does not have a loop gain greater than or equal to 1 due to the loop gain being reduced by the first resistive element. In addition, the second control terminal is fixed at the direct-current power supply voltage. Due to this configuration, a high-frequency feedback signal is attenuated, and therefore a stable amplification circuit in which oscillation is prevented can be provided.

In addition, the amplification circuit may further include: a first inductance element that is serially arranged on the first path that connects the fourth terminal and the power supply terminal; and a second capacitance element that is serially arranged between the fourth terminal and the output terminal; and the first resistive element may be serially arranged on the first path between the first inductance element and the power supply terminal.

Due to this configuration, the first resistive element is arranged in a region outside the first transistor, the second transistor, and a matching network formed by the first inductance element and the second capacitance element, and therefore the degradation of the gain of the amplifier formed by the first transistor and the second transistor can be suppressed.

Furthermore, the first resistive element may be a first switch, and the first switch may be serially arranged on the first path that connects the fourth terminal and the power supply terminal.

Due to this configuration, a so-called off leakage current that flows from the power supply terminal to the ground terminal via the fourth terminal, the third terminal, the second terminal, and the first terminal can be suppressed by putting the first switch into a non-conductive state when the first transistor and the second transistor are not operating.

In addition, when the amplification circuit is performing an amplification operation, the first switch may be in a conductive state, and when the amplification circuit is not performing an amplification operation, the first switch may be in a non-conductive state.

Due to this configuration, when the amplification circuit is performing an amplification operation, oscillation in the amplification circuit can be suppressed, and when the amplification circuit is not performing an amplification operation, the off leakage current of the amplification circuit can be suppressed.

In addition, the amplification circuit may further include: a second resistive element that is serially arranged on only a second path among the first path and the second path, which connects the second control terminal and the power supply terminal, and that is a second resistor or a second switch.

Due to this configuration, even in the case where the necessary resistance value is not secured using only the on resistance of the switch when the switch is in a conductive state, sufficient loop attenuation can be realized using the second resistor element while fixing the potential of the second control terminal.

In addition, the amplification circuit may further include: a third resistive element that is connected in parallel with the first inductance element.

Due to this configuration, even in the case where the necessary resistance value is not secured using just the on resistance of the first switch, sufficient loop attenuation can be realized using the third resistive element.

According to the present disclosure, there can be provided a stable cascode-connection amplification circuit in which oscillation is prevented.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 10A is a diagram illustrating a circuit state when the amplification circuit according to embodiment 2 is operating;

FIG. 10B is a diagram illustrating a circuit state when the amplification circuit according to embodiment 2 is not operating.

DETAILED DESCRIPTION OF THE DISCLOSURE

Figure 1:
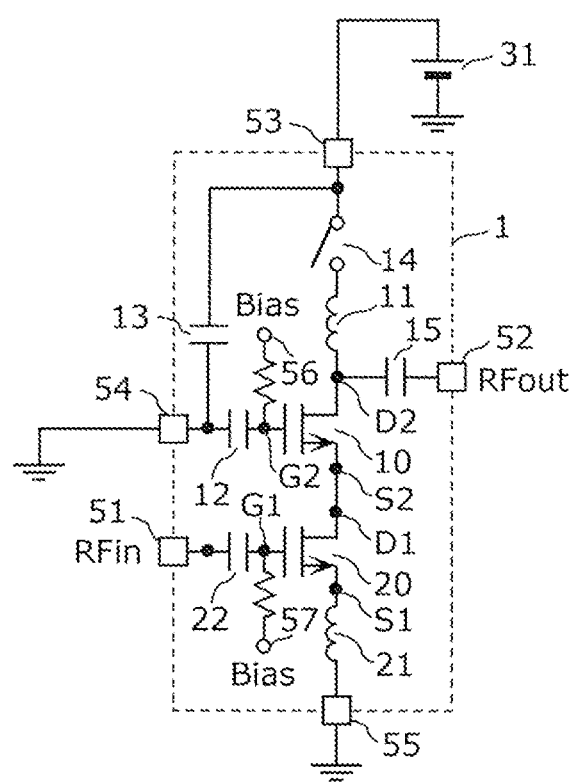
FIG. 1 is a circuit configuration diagram of an amplification circuit according to embodiment 1 and circuits peripheral to the amplification circuit.

Hereafter, embodiments of the present disclosure will be described in detail using embodiments and the drawings. The embodiments described hereafter each illustrate a comprehensive or specific example of the present disclosure. The numerical values, shapes, materials, constituent elements, arrangement of the constituent elements, the ways in which the constituent elements are connected to each other and so forth given in the following embodiments are merely examples and are not intended to limit the present disclosure. Constituent elements not described in the independent claims among constituent elements in the following embodiments are described as arbitrary constituent elements. In addition, the sizes or size ratios between the constituent elements illustrated in the drawings are not necessarily strictly accurate.

Embodiment 1

1.1 Configuration of Amplification Circuit

FIG. 1 is a circuit configuration diagram of an amplification circuit 1 according to embodiment 1 and circuits peripheral to the amplification circuit 1. As illustrated in the figure, the amplification circuit 1 includes an input terminal 51, an output terminal 52, a power supply terminal 53, ground terminals 54 and 55, transistors 10 and 20, inductors 11 and 21, capacitors 13 and 15, and a switch 14.

The power supply terminal 53 is connected to a power supply 31 that generates a direct-current power supply voltage. In addition, the ground terminals 54 and 55 are grounded. A high-frequency signal (RFin) is inputted to the input terminal 51 and a high-frequency signal (RFout) amplified by the transistors 10 and 20 is outputted from output terminal 52. As illustrated in the figure, the power supply 31 is not an essential constituent element of the amplification circuit 1 and does not need to be included inside the amplification circuit 1.

The transistor 20 is a first transistor that has a source terminal S1 (first terminal), a drain terminal D1 (second terminal), and a gate terminal G1 (first control terminal), and is for example an n-type field effect transistor.

The transistor 10 is a second transistor that has a source terminal S2 (third terminal), a drain terminal D2 (fourth terminal), and a gate terminal G2 (second control terminal), and is for example an n-type field effect transistor.

The transistors 10 and 20 may instead be p-type field effect transistors, or for example may be bipolar transistors. In the case where the transistors 10 and 20 are bipolar transistors, for example, the source terminals will be emitter terminals, the drain terminals will be collector terminals, and the gate terminals will be base terminals.

In the amplification circuit 1 according to this embodiment, the drain terminal D1 is connected to the source terminal S2, the source terminal S1 is connected to the ground terminal 55 via the inductor 21, and the gate terminal G1 is connected to the input terminal 51 via a capacitor 22. In addition, the drain terminal D2 is connected to the output terminal 52 via the capacitor 15, and the gate terminal G2 is connected to the ground terminal 54 via the capacitor 12. In other words, the transistor 10 is cascode connected to the transistor 20, and the amplification circuit 1 forms a cascode-connection amplification circuit.

The inductor 11 is a first inductance element that is serially arranged on a first path that connects the drain terminal D2 and the power supply terminal 53, and is a matching element for realizing impedance matching between the transistors 10 and 20 and an externally connected circuit. The inductor 21 is a second inductance element that is serially arranged on a path that connects the source terminal S1 and the ground terminal 55, and is a source degeneration inductor. The inductors 11 and 21 are not essential constituent elements of the amplification circuit 1 according to this embodiment.

The capacitor 15 is a second capacitance element that is serially arranged between the drain terminal D2 and the output terminal 52. The capacitor 15 is a DC cutting element for removing a direct-current bias component of a high-frequency signal amplified by the transistors 10 and 20, and is also a matching element for realizing impedance matching between the transistors 10 and 20 and an externally connected circuit.

The capacitor 13 is a first capacitance element that is serially arranged on a second path that connects the gate terminal G2 and the power supply terminal 53. The capacitor 13 functions as a pass capacitor for selectively allowing a high-frequency signal to pass along the second path, and also has a DC cutting function for preventing an unwanted current from flowing along the second path when a direct-current power supply voltage of the power supply 31 is applied to the ground terminal 54 via the power supply terminal 53.

The switch 14 is a switch that is serially arranged on the first path that connects the drain terminal D2 and the power supply terminal 53 to each other and is a so-called first resistive element that functions as a resistance element having an on resistance when in a conductive state.

In other words, according to the above connection configuration, the drain terminal D2 and the gate terminal G2 are connected to each other via the inductor 11, the switch 14, and the capacitor 13.

According to the above-described configuration of the amplification circuit 1 according to this embodiment, the gate terminal G2 of the transistor 10 is grounded (in a high-frequency manner via the capacitor 12). At this time, a parasitic inductance component, which is for example caused by a wiring line used to (high-frequency) ground the gate terminal G2, is generated at the gate terminal G2.

Therefore, in the amplification circuit of the related art, a problem occurs in that since the stability of the transistor is reduced due to the potential of the gate terminal not being (high-frequency) grounded in a fixed manner due to this parasitic inductance component, feedback occurs due to for example a parasitic capacitance generated between the drain terminal D2 and the gate terminal G2 and between the gate terminal G2 and the drain terminal D1, and an oscillation undesirably occurs when a loop formed by the feedback has loop gain that is greater than or equal to 1.

With respect to this, in the above-described configuration of the amplification circuit 1 according to this embodiment, the drain terminal D2 connected to the output terminal 52 and the grounded gate terminal G2 are (high-frequency) connected to each other via the switch 14. Therefore, when the switch 14 is in a conductive state, the drain terminal D2, the inductor 11, the switch 14, the capacitor 13, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to the on resistance. In other words, a high-frequency signal outputted from the drain terminal D2 is returned via the loop in an attenuated state without passing through a parasitic capacitance or the like generated in the vicinity of the transistor 10. In addition, the potential of the ground terminal 54 is isolated from the power supply potential by the capacitor 13 arranged on the second path. Thus, even when a parasitic inductance component is generated at the gate terminal G2, feedback signals in both directions between the drain terminal D2 and the gate terminal G2 are attenuated by this loop, and therefore a stable amplification circuit 1 in which oscillation is prevented can be provided.

In the case where the amplification circuit 1 is not performing an amplification operation, the switch 14 is in a non-conductive state, and therefore a so-called off leakage current of the transistors 10 and 20 that flows from the power supply terminal 53 to the ground terminal 55 via the drain terminal D2, the source terminal S2, the drain terminal D1, and the source terminal S1 can be suppressed. From this point of view, it is preferable that the switch 14 be arranged on the first path out of the first path and the second path. However, from the viewpoint of the feedback circuit being able to form a loop that does not have a loop gain greater than or equal to 1 (feedback signal is attenuated) due to the on resistance of the switch 14, the switch 14 may be arranged on the second path that connects the gate terminal G2, the capacitor 13, and the power supply terminal 53 to each other.

In addition, the switch 14 may be a first resistor (resistive element) rather than a switch that switches between a conductive state and a non-conductive state. However, in this case, the effect of being able to suppress the off leakage current using the first resistor is low, and therefore the first resistor may be arranged on the first path or the second path.

The amplification circuit 1 according to this embodiment further includes a bias terminal 57 that is connected to the gate terminal G1, a bias terminal 56 that is connected to the gate terminal G2, the capacitor 22 that is serially arranged between the gate terminal G1 and the input terminal 51, and the capacitor 12 that is serially arranged between the gate terminal G2 and the ground terminal 54.

A bias circuit is connected to the bias terminal 57. The bias circuit generates a direct-current bias voltage or direct-current bias current for setting the operation point of the transistor 20. A bias circuit is connected to the bias terminal 56. The bias circuit generates a direct-current bias voltage or direct-current bias current for setting the operation point of the transistor 10. In this way, the transistors 10 and 20 can be set to optimum operation points. The DC cut capacitor 22 is arranged such that a direct-current bias component is not allowed to leak to the input terminal 51 in the case where a direct-current bias component is applied to the gate terminal G1. The DC cut capacitor 12 is arranged such that a direct-current bias component is not allowed to leak to the ground terminal 54 in the case where a direct-current bias component is applied to the gate terminal G2.

In addition, it is preferable that the first resistive element (switch 14 or first resistor) be serially arranged on either the first path or the second path between the inductor 11 and the gate terminal G2. In other words, the resistive element is preferably not serially arranged between the drain terminal D2 and the inductor 11.

The inductor 11 is a matching element that is for realizing impedance matching between the transistors 10 and 20 and an externally connected circuit, and therefore the inductor 11 is formed outside the region in which the transistors 10 and 20 are formed. Thus, the resistive element is arranged in a region outside the transistors 10 and 20 and a matching network formed by the inductor 11 and the capacitor 15, and therefore does not affect the gain of an amplifier formed by the transistors 10 and 20.

The first resistive element may be a first resistor and the first resistor may be serially arranged on just the second path out of the first path and the second path. As a result, the voltage of the transistor 10 is not reduced by a current flowing through the first resistive element, and therefore the degradation of the amplification characteristics can be suppressed.

Figure 2A:
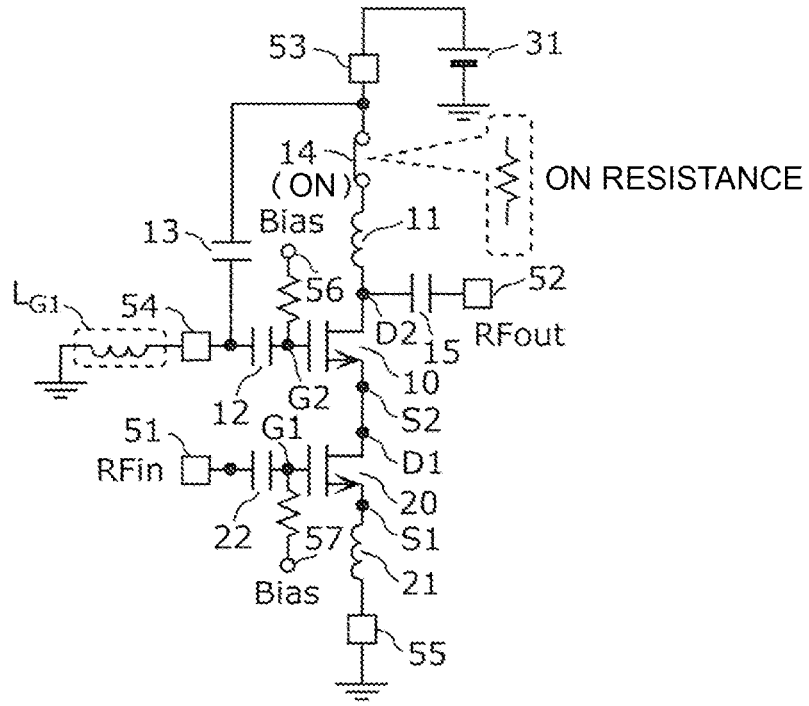
FIG. 2A is a diagram illustrating a circuit state when the amplification circuit according to embodiment 1 is operating.
Figure 2B:
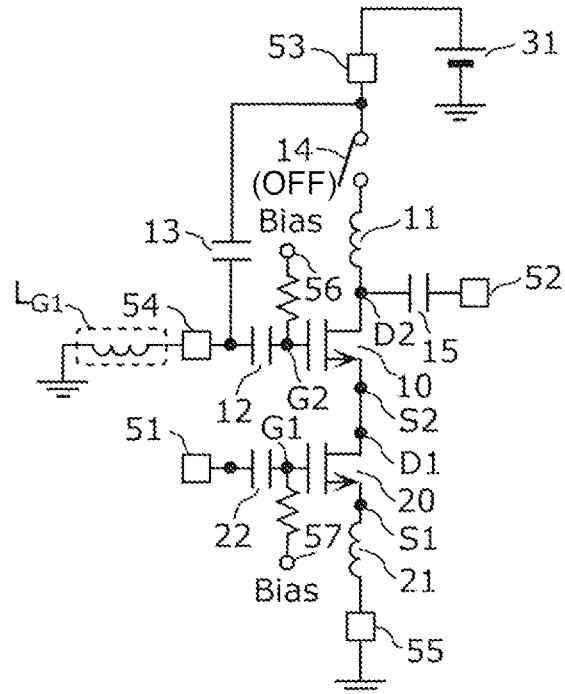
FIG. 2B is a diagram illustrating a circuit state when the amplification circuit according to embodiment 1 is not operating.

FIG. 2A is a diagram illustrating a circuit state when the amplification circuit 1 according to embodiment 1 is operating. FIG. 2B is a diagram illustrating a circuit state when the amplification circuit 1 according to embodiment 1 is not operating. As illustrated in FIGS. 2A and 2B, the switch 14 is serially arranged on the first path that connects the drain terminal D2 and the power supply terminal 53 to each other. In addition, a parasitic inductance $L_{G1}$ is generated at the gate terminal G2 due to a wiring line or the like for (high-frequency) grounding the gate terminal G2.

With respect to this, as illustrated in FIG. 2A, when a high-frequency signal (RFin) is inputted and the amplification circuit 1 performs an amplification operation, the switch 14 is in a conductive state. On the other hand, as illustrated in FIG. 2B, when the amplification circuit 1 is not performing an amplification operation, the switch 14 is in a non-conductive state.

When an amplification operation is performed, the switch 14 has an on resistance when in a conductive state, and therefore the feedback circuit forms a loop that does not have a loop gain that is greater than or equal to 1 (feedback signal is attenuated) due to the on resistance. Thus, even when the parasitic inductance $L_{G1}$ is generated at the gate terminal G2, a high-frequency feedback signal between the drain terminal D2 and the gate terminal G2 is attenuated by this loop, and therefore a stable amplification circuit 1 in which oscillation is prevented can be provided.

On the other hand, when an amplification operation is not being performed, the switch 14 is in a non-conductive state, and a so-called off leakage current that flows from the power supply terminal 53 to the ground terminal 55 via the drain terminal D2, the source terminal S2, the drain terminal D1, and the source terminal S1 can be suppressed.

In other words, in the amplification circuit 1 in which the switch 14 is serially arranged on the first path, oscillation can be suppressed in the amplification circuit 1 when the amplification circuit 1 is performing an amplification operation, and the off leakage current of the amplification circuit 1 can be suppressed when the amplification circuit 1 is not performing an amplification operation.

In particular, as the frequency becomes higher, the impedance ($j\omega L_{G1}$) of the parasitic inductance $L_{G1}$ increases and the grounding characteristic of the gate terminal G2 of the transistor 10 deteriorates. Thus, feedback via the gate terminal G2 is more likely to occur. In general, in the case where a high-performance transistor having a gain of up to several tens of GHz is used, there is a possibility that the loop gain of the loop formed by this feedback will be greater than or equal to 1. In addition, the off leakage current tends to increase if the performance of the transistor is higher.

With respect to this, the amplification circuit 1 according to this embodiment is characterized in that, even when the high-frequency amplification performances of the transistors 10 and 20 are high, a feedback circuit can be formed in which a feedback signal is attenuated and in that the off leakage current can be suppressed.

1.2 Stability Factor of Amplification Circuit

Figure 3:
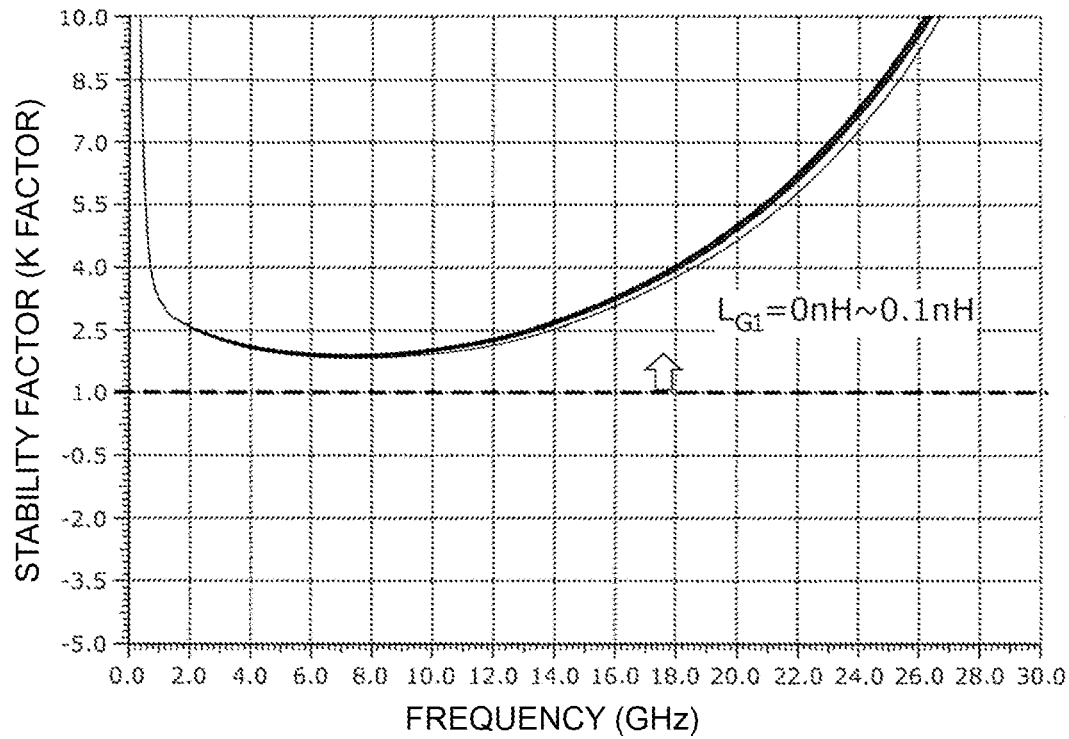
FIG. 3 is a graph illustrating a stability factor of the amplification circuit according to embodiment 1.

FIG. 3 is a graph illustrating the stability factor of the amplification circuit 1 according to embodiment 1. This figure illustrates the frequency characteristics of the stability factor (K factor) of the amplification circuit 1 when the value of the parasitic inductance generated at the gate terminal G2 is changed ($L_{G1}$=0-0.1 nH). As illustrated in the figure, in the amplification circuit 1 according to embodiment 1, even when the parasitic inductance $L_{G1}$ ($L_{G1}$=0-0.1 nH) is generated at the gate terminal G2, the loop gain of the loop formed by feedback in a frequency band (~30 GHz) is not greater than or equal to 1. Since the stability factor (K factor) of the amplification circuit 1, which includes a feedback circuit in which there is no possibility of the loop gain being greater than or equal to 1, can be greater than or equal to 1, a stable amplification operation in which oscillation is prevented can be provided.

An amplification circuit 500 of the related art according to a comparative example will be described below for comparison with the amplification circuit 1 according to the embodiment described above.

Figure 4:
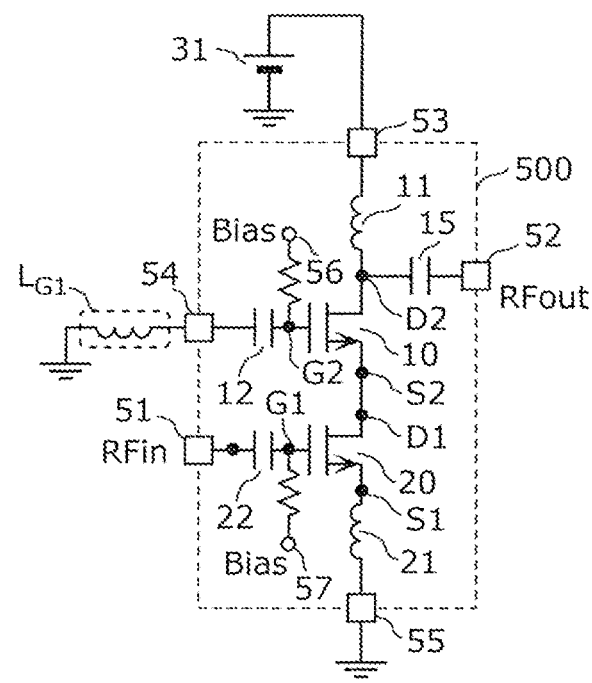
FIG. 4 is a circuit configuration diagram of an amplification circuit according to a comparative embodiment and circuits peripheral thereto.

FIG. 4 is a circuit configuration diagram of the amplification circuit 500 according to the comparative embodiment and circuits peripheral thereto. As illustrated in the figure, the amplification circuit 500 according to the comparative example includes the input terminal 51, the output terminal 52, the power supply terminal 53, the ground terminals 54 and 55, the transistors 10 and 20, the inductors 11 and 21, and the capacitor 15. The configuration of the amplification circuit 500 according to the comparative example differs from the configuration of the amplification circuit 1 according to embodiment 1 in that: (1) the switch 14 is not arranged; (2) the capacitor 13 is not arranged; and (3) the drain terminal D2 and the ground terminal 54 are not connected to each other via the power supply terminal 53. Hereafter, the description of the amplification circuit 500 according to the comparative example will focus on the points that are different from the amplification circuit 1 according to embodiment 1, and the description of the points that are the same will be omitted.

In the amplification circuit 500 according to the comparative example, the drain terminal D1 is connected to the source terminal S2, the source terminal S1 is connected to the ground terminal 55 via the inductor 21, and the gate terminal G1 is connected to the input terminal 51 via the capacitor 22. In addition, the drain terminal D2 is connected to the output terminal 52 via the capacitor 15, and the gate terminal G2 is connected to the ground terminal 54 via the capacitor 12. In other words, the transistor 10 is cascode connected to the transistor 20, and the amplification circuit 500 forms a cascode-connection amplification circuit.

Here, the drain terminal D2 and the gate terminal G2 are not connected to each other via the inductor 11 and the power supply terminal 53.

According to the above-described configuration of the amplification circuit 500 according to the comparative example, the gate terminal G2 of the transistor 10 is grounded (in a high-frequency manner via the capacitor 12). At this time, a parasitic inductance component $L_{G1}$ is generated at the gate terminal G2 due to a wiring line or the like used to (high-frequency) ground the gate terminal G2.

Therefore, in the amplification circuit 500, since the stability of the transistor is reduced due to the potential of the gate terminal G2 not being (high-frequency) grounded in a fixed manner due to the parasitic inductance component $L_{G1}$, feedback occurs, and an oscillation undesirably occurs when the loop gain is greater than or equal to 1.

In particular, as the frequency becomes higher, the impedance of the parasitic inductance $L_{G1}$ becomes larger and the grounding characteristic of the gate terminal G2 of the transistor 10 deteriorates. Thus, feedback via the gate terminal G2 is more likely to occur. In general, in the case where a high-performance transistor having a gain of up to several tens of GHz is used, there is a possibility that the loop gain of the loop formed by this feedback will be greater than or equal to 1.

Figure 5:
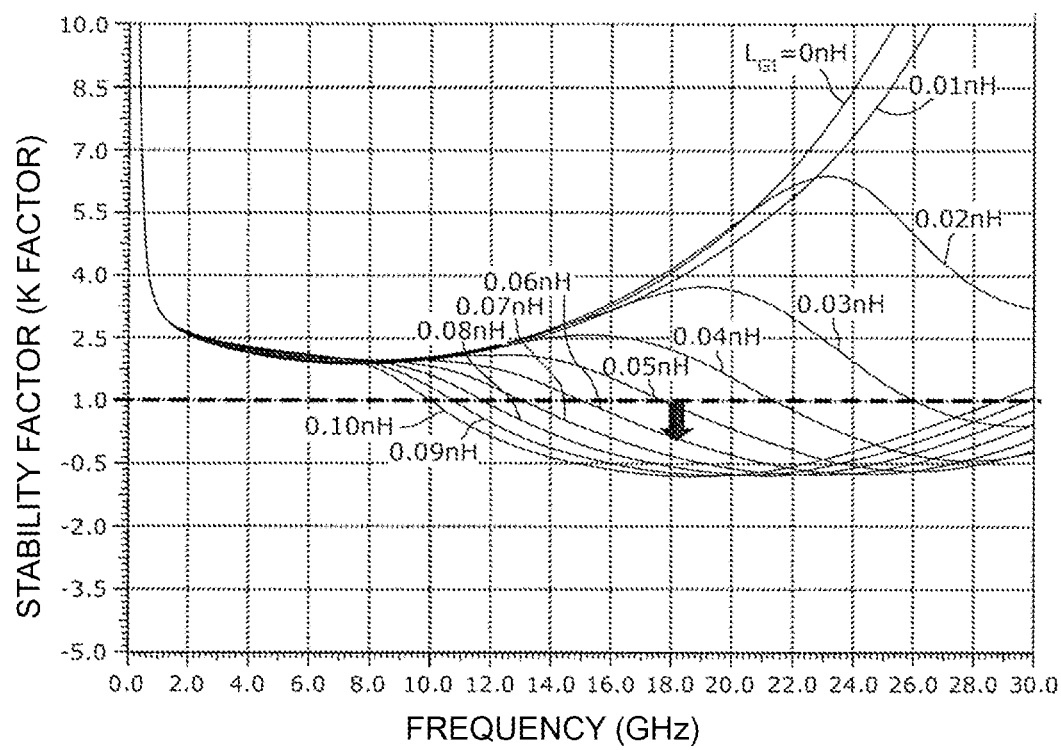
FIG. 5 is a graph illustrating a stability factor of the amplification circuit according to the comparative embodiment.

FIG. 5 is a graph illustrating the stability factor of the amplification circuit 500 according to the comparative embodiment. This figure illustrates the frequency characteristics of the stability factor (K factor) of the amplification circuit 500 when the value of the parasitic inductance generated at the gate terminal G2 is changed ($L_{G1}$=0-0.1 nH). As illustrated in the figure, in the amplification circuit 500 according to the comparative example, the stability factor (K factor) is degraded when a parasitic inductance greater than or equal to 0.02 nH is generated at the gate terminal G2. Furthermore, as the parasitic inductance $L_{G1}$ increases ($L_{G1}$=0.03 or higher), the stability factor (K factor) becomes smaller than 1 in a frequency band of 10 GHz and higher, there is a high possibility of an oscillation being generated, and the amplification operation becomes unstable.

In contrast, in the amplification circuit 1 according to this embodiment, even when the parasitic inductance $L_{G1}$ ($L_{G1}$=0-0.1 nH) is generated at the gate terminal G2, the stability factor (K factor) in a high-frequency band (~30 GHz) can be made to be greater than or equal to 1, and therefore a stable amplification operation in which oscillation is prevented can be provided.

1.3 Amplification Circuit According to Modification 1

Figure 6A:
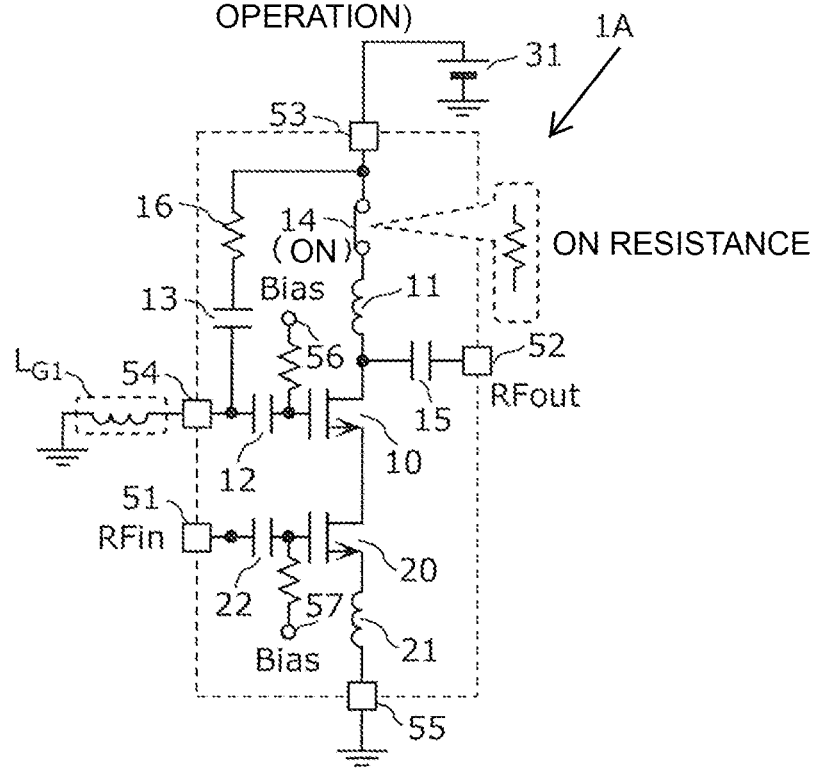
FIG. 6A is a diagram illustrating a circuit state when an amplification circuit according to modification 1 of embodiment 1 is operating.
Figure 6B:
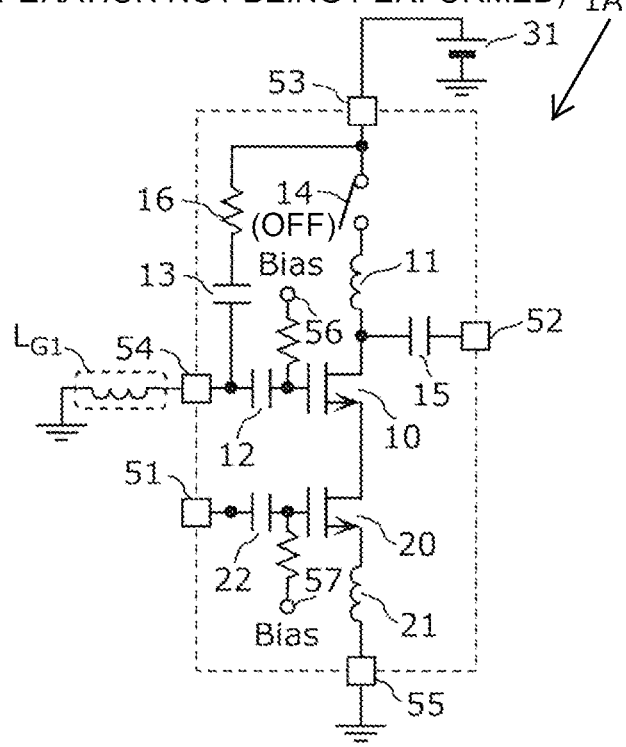
FIG. 6B is a diagram illustrating a circuit state when the amplification circuit according to modification 1 of embodiment 1 is not operating.

FIG. 6A is a diagram illustrating a circuit state when an amplification circuit 1A according to modification 1 of embodiment 1 is operating. In addition, FIG. 6B is a diagram illustrating a circuit state when the amplification circuit 1A according to modification 1 of embodiment 1 is not operating. In addition, FIG. 6C is another a diagram illustrating a circuit state when the amplification circuit 1A according to modification 1 of embodiment 1 is operating where resistive element 16 is illustrated as a switch 16a.

Figure 6C:
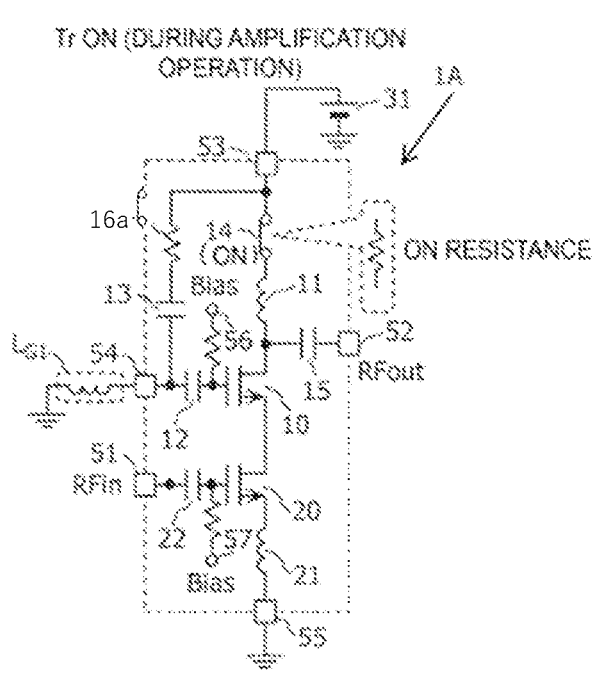
FIG. 6C is another diagram illustrating a circuit state when an amplification circuit according to modification 1 of embodiment 1 is operating.

As illustrated in FIGS. 6A, 6B, and 6C, the amplification circuit 1A according to this modification includes the input terminal 51, the output terminal 52, the power supply terminal 53, the ground terminals 54 and 55, the transistors 10 and 20, the inductors 11 and 21, the capacitors 13 and 15, the switch 14, and a resistor 16 or a switch 16a. The configuration of the amplification circuit 1A according to this modification differs from the configuration of the amplification circuit 1 according to embodiment 1 only in that the resistor 16 or the switch 16a is additionally provided. Hereafter, the description of the amplification circuit 1A according to modification 1 will focus on the points that are different from the amplification circuit 1 according to embodiment 1, and the description of the points that are the same will be omitted.

The resistor 16 is a second resistor that is serially arranged between the power supply terminal 53 and the capacitor 13. In addition, it is sufficient that the resistor 16 be arranged on the second path that connects the gate terminal G2 and the power supply terminal 53 to each other. Thus, the drain terminal D2 and the gate terminal G2 are connected to each other via the inductor 11, the switch 14, the resistor 16, and the capacitor 13.

In the above-described configuration of the amplification circuit 1A according to this modification, the drain terminal D2 and the gate terminal G2 are connected to each other via the switch 14. Therefore, when the switch 14 is in a conductive state, the drain terminal D2, the inductor 11, the switch 14, the resistor 16, the capacitor 13, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to the series resistance component formed by the on resistance and the resistor 16. Therefore, even in the case where the resistance value needed to attenuate the feedback signal is not secured with just the on resistance of the switch 14, sufficient loop attenuation can be realized using the resistor 16.

The resistor 16 may be a second resistor or a second switch serially arranged on either the first path or the second path. Thus, even in the case where the necessary resistance value is not secured with just the on resistance of the switch 14 when the switch 14 is in a conductive state, sufficient loop attenuation can be realized using a second resistive element.

In addition, a high-frequency signal is allowed to selectively pass along the second path by the capacitor 13 arranged on the second path. Thus, even when the parasitic inductance is generated at the gate terminal, a high-frequency feedback signal between the drain terminal D2 and the gate terminal G2 is attenuated by this loop, and therefore a stable amplification circuit 1A in which oscillation is prevented can be provided.

In the case where the amplification circuit 1A is not performing an amplification operation, the switch 14 is in a non-conductive state, and therefore a so-called off leakage current that flows from the power supply terminal 53 to the ground terminal 55 via the drain terminal D2, the source terminal S2, the drain terminal D1, and the source terminal S1 can be suppressed. From this point of view, the switch 14 is preferably arranged on the first path. However, from the viewpoint of the feedback circuit being able to form a loop that does not have a loop gain of greater than or equal to 1 (feedback signal is attenuated) due to the on resistance of the switch 14, the switch 14 may be arranged on the second path that connects the gate terminal G2, the capacitor 13, the resistor 16, and the power supply terminal 53 to each other.

In addition, the switch 14 may be a first resistor (first resistive element) rather than a switch that switches between a conductive state and a non-conductive state. However in this case, the effect of being able to suppress the off leakage current using the first resistor is low. Therefore, the first resistor may be arranged on either the first path or the second path, and the degree of attenuation of the feedback signal can be adjusted using two resistors consisting of the first resistor and the resistor 16 (second resistor).

In addition, as illustrated in FIGS. 6A and 6C, when a high-frequency signal (RFin) is inputted and the amplification circuit 1A performs an amplification operation, the switch 14 is in a conductive state. On the other hand, as illustrated in FIG. 6B, when the amplification circuit 1A is not performing an amplification operation, the switch 14 is in a non-conductive state.

Since the switch 14 has an on resistance in a conductive state when an amplification operation is being performed, the feedback signal between the drain terminal D2 and the gate terminal G2 is attenuated and the stable amplification circuit 1A in which oscillation is prevented can be provided. On the other hand, when an amplification operation is not being performed, the switch 14 is in a non-conductive state, and a so-called off leakage current that flows from the power supply terminal 53 to the ground terminal 55 via the drain terminal D2, the source terminal S2, the drain terminal D1, and the source terminal S1 can be suppressed.

1.4 Amplification Circuit According to Modification 2

Figure 7:
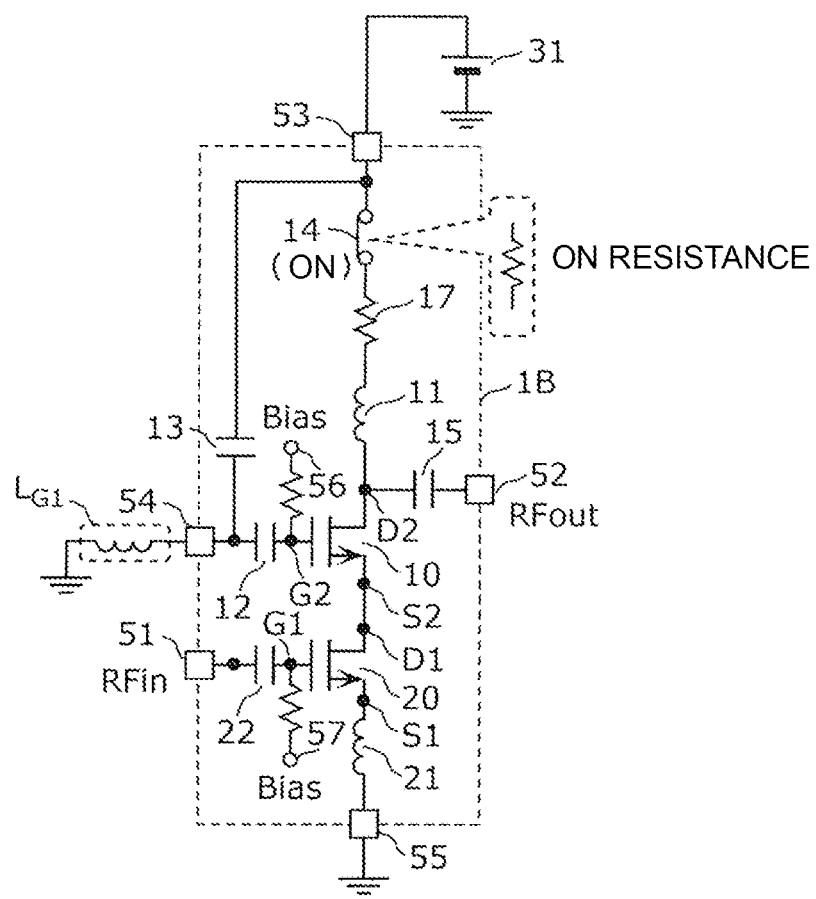
FIG. 7 is a circuit configuration diagram of an amplification circuit according to modification 2 of embodiment 1 and circuits peripheral thereto.

FIG. 7 is a circuit configuration diagram of an amplification circuit 1B according to modification 2 of embodiment 1 and circuits peripheral thereto. As illustrated in FIG. 7, the amplification circuit 1B according to this modification includes the input terminal 51, the output terminal 52, the power supply terminal 53, the ground terminals 54 and 55, the transistors 10 and 20, the inductors 11 and 21, the capacitors 13 and 15, the switch 14, and a resistor 17. The configuration of the amplification circuit 1B according to this modification differs from the configuration of the amplification circuit 1A according to modification 1 only in that the resistor 17 is added instead of the resistor 16. Hereafter, the description of the amplification circuit 1B according to modification 2 will focus on the points that are different from the amplification circuit 1A according to modification 1, and the description of the points that are the same will be omitted.

The resistor 17 is a second resistor that is serially arranged between the power supply terminal 53 and the inductor 11. In addition, the resistor 17 may be arranged on the first path that connects the drain terminal D2 and the power supply terminal 53 to each other. Thus, the drain terminal D2 and the gate terminal G2 are connected to each other via the inductor 11, the resistor 17, the switch 14, the power supply terminal 53, and the capacitor 13.

In the above-described configuration of the amplification circuit 1B according to this modification, the drain terminal D2 and the gate terminal G2 are connected to each other via the switch 14. Therefore, when the switch 14 is in a conductive state, the drain terminal D2, the inductor 11, the resistor 17, the switch 14, the capacitor 13, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to the serially connected resistances of the on resistance and the resistor 17. Therefore, even in the case where the resistance value needed to attenuate the feedback signal is not secured with just the on resistance of the switch 14, sufficient loop attenuation can be realized using the resistor 17.

In addition, the switch 14 may be a first resistor (resistive element) rather than a switch that switches between a conductive state and a non-conductive state. In this case, the effect of being able to suppress the off leakage current using the first resistor is low. Therefore, the first resistor may be arranged on either the first path or the second path, and the degree of attenuation of the feedback signal can be adjusted using two resistors consisting of the first resistor and the resistor 17 (second resistor).

In addition, the resistor 17 may be arranged on the first path that connects the drain terminal D2 and the power supply terminal 53 to each other, and as illustrated in FIG. 7, in the case where the resistor 17 is serially arranged between the power supply terminal 53 and the inductor 11, the resistor 17 is arranged in a region outside the transistors 10 and 20 and the matching network formed of the inductor 11 and the capacitor 15, and therefore the resistor 17 does not affect the gain of the amplifier formed by the transistors 10 and 20.

1.5 Amplification Circuit According to Modification 3

Figure 8:
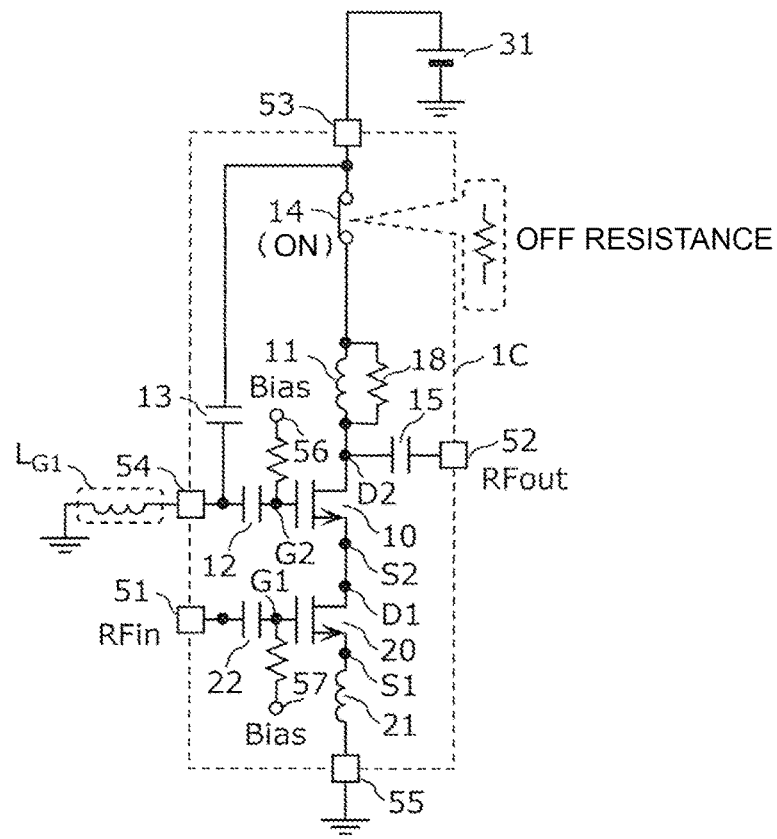
FIG. 8 is a circuit configuration diagram of an amplification circuit according to modification 3 of embodiment 1 and circuits peripheral thereto.

FIG. 8 is a circuit configuration diagram of an amplification circuit 1C according to modification 3 of embodiment 1 and circuits peripheral thereto. As illustrated in FIG. 8, the amplification circuit 1C according to this modification includes the input terminal 51, the output terminal 52, the power supply terminal 53, the ground terminals 54 and 55, the transistors 10 and 20, the inductors 11 and 21, the capacitors 13 and 15, the switch 14, and a resistor 18. The configuration of the amplification circuit 1C according to this modification differs from the configuration of the amplification circuit 1B according to modification 2 only in that the resistor 18 is added instead of the resistor 17. Hereafter, the description of the amplification circuit 1C according to modification 3 will focus on the points that are different from the amplification circuit 1B according to modification 2, and the description of the points that are the same will be omitted.

The resistor 18 is a third resistive element that is connected in parallel with the inductor 11. Thus, the drain terminal D2 and the gate terminal G2 are connected to each other via a parallel connection circuit consisting of the inductor 11 and the resistor 18 and via the switch 14, the power supply terminal 53, and the capacitor 13.

In the above-described configuration of the amplification circuit 1C according to this modification, the drain terminal D2 and the gate terminal G2 are connected to each other via the switch 14. Therefore, when the switch 14 is in a conductive state, the drain terminal D2, the parallel connection circuit, the switch 14, the capacitor 13, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to a series connection circuit consisting of the on resistance and the parallel connection circuit. Therefore, even in the case where the resistance value needed to attenuate the feedback signal is not secured with just the on resistance of the switch 14, sufficient loop attenuation can be realized using the resistor 18.

In addition, the switch 14 may be a first resistor (resistive element) rather than a switch that switches between a conductive state and a non-conductive state. In this case, the effect of being able to suppress the off leakage current using the first resistor is low. Therefore, the first resistor may be arranged on either the first path or the second path, and the degree of attenuation of the feedback signal can be adjusted using two resistors consisting of the first resistor and the resistor 18 (third resistive element).

Embodiment 2

The amplification circuit according to embodiment 1 has a configuration in which the gate terminal of the cascode-connected transistor 10 is grounded, whereas in this embodiment, an amplification circuit will be described that has a configuration in which the gate terminal of the cascode-connected transistor 10 is fixed at the power supply voltage.

2.1 Configuration of Amplification Circuit

Figure 9:
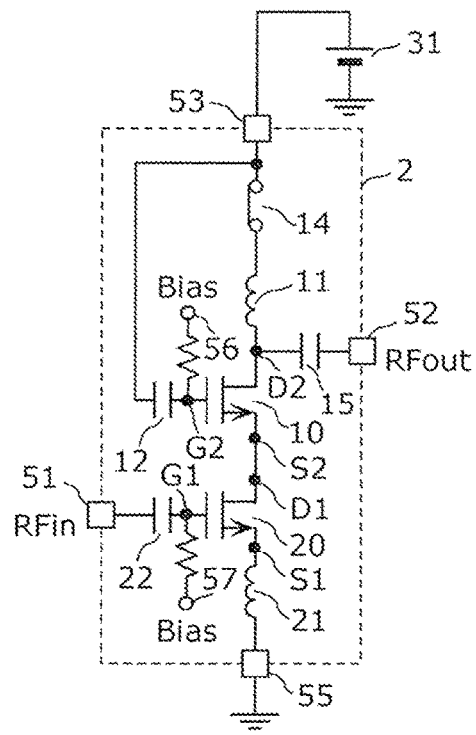
FIG. 9 is a circuit configuration diagram of an amplification circuit according to embodiment 2 and circuits peripheral thereto.

FIG. 9 is a circuit configuration diagram of an amplification circuit 2 according to embodiment 2 and circuits peripheral to the amplification circuit. As illustrated in the figure, the amplification circuit 2 includes the input terminal 51, the output terminal 52, the power supply terminal 53, the ground terminal 55, the transistors 10 and 20, the inductors 11 and 21, the capacitor 15, and the switch 14. The configuration of the amplification circuit 2 according to this embodiment differs from the configuration of the amplification circuit 1 according to embodiment 1 in that there is no ground terminal 54 and in that the gate terminal G2 is fixed (in a high-frequency manner) at power supply voltage. Hereafter, the description of the amplification circuit 2 according to embodiment 2 will focus on the points that are different from the amplification circuit 1 according to embodiment 1, and the description of the points that are the same will be omitted.

The power supply terminal 53 is connected to the power supply 31 that generates a direct-current power supply voltage. In addition, the ground terminal 55 is grounded. A high-frequency signal (RFin) is inputted to the input terminal 51 and a high-frequency signal (RFout) amplified by the transistors 10 and 20 is outputted from output terminal 52.

In the amplification circuit 2 according to this embodiment, the drain terminal D1 is connected to the source terminal S2, the source terminal S1 is connected to the ground terminal 55 via the inductor 21, and the gate terminal G1 is connected to the input terminal 51 via the capacitor 22. In addition, the drain terminal D2 is connected to the output terminal 52 via the capacitor 15, and the gate terminal G2 is connected to the ground terminal 53 via the capacitor 12. In other words, the transistor 10 is cascode connected to the transistor 20, and the amplification circuit 2 forms a cascode-connection amplification circuit.

The switch 14 is a switch that is serially arranged on the first path that connects the drain terminal D2 and the power supply terminal 53 to each other and is a so-called first resistive element that functions as a resistor having an on resistance when in a conductive state.

In other words, according to the above connection configuration, the drain terminal D2 and the gate terminal G2 are connected to each other via the inductor 11, the switch 14, and the power supply terminal 53.

According to the above-described configuration of the amplification circuit 2 according to this embodiment, the gate terminal G2 of the transistor 10 is connected (in a high-frequency manner via the capacitor 12) to a direct-current power supply voltage. At this time, a parasitic inductance component, which is for example caused by a wiring line used to connect the power supply terminal 53 and the power supply 31, is generated at the gate terminal G2.

Therefore, since the stability of the transistor is reduced due to the potential of the gate terminal G2 not being fixed (with respect to high frequencies), feedback occurs, and an oscillation undesirably occurs when the loop gain is greater than or equal to 1.

In contrast, in the above-described configuration of the amplification circuit 2 according to this embodiment, the drain terminal D2 connected to the output terminal 52 and the gate terminal G2 are (high-frequency) connected to each other via the switch 14. Therefore, when the switch 14 is in a conductive state, the drain terminal D2, the inductor 11, the switch 14, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to the on resistance. In addition, the gate terminal G2 is not grounded (via the capacitor 12) and a resistive element such as the switch 14 is not arranged on the second path, and therefore the potential of the gate terminal G2 is stably set to a power supply potential. Thus, even when a parasitic inductance component is generated at the gate terminal G2, a high-frequency feedback signal between the drain terminal D2 and the gate terminal G2 is attenuated by this loop, and therefore a stable amplification circuit 2 in which oscillation is prevented can be provided.

In the case where the amplification circuit 2 is not performing an amplification operation, the switch 14 is in a non-conductive state, and therefore a so-called off leakage current that flows from the power supply terminal 53 to the ground terminal 55 via the drain terminal D2, the source terminal S2, the drain terminal D1, and the source terminal S1 can be suppressed.

In addition, the switch 14 may be a first resistor (first resistive element) rather than a switch that switches between a conductive state and a non-conductive state. In this case as well, the drain terminal D2, the inductor 11, the first resistor, and the gate terminal G2 form a high-frequency signal feedback circuit between the drain terminal D2 and the gate terminal G2, and form a loop that does not have a loop gain greater than or equal to 1 due to the first resistor (feedback signal is attenuated). Thus, even when a parasitic inductance component is generated at the gate terminal G2, a high-frequency feedback signal between the drain terminal D2 and the gate terminal G2 is attenuated by this loop, and therefore a stable amplification circuit 2 in which oscillation is prevented can be provided.

In addition, it is preferable that the first resistive element (switch 14 or first resistor) be serially arranged on the first path between the inductor 11 and the gate terminal G2.

The inductor 11 is a matching element that is for realizing impedance matching between the transistors 10 and 20 and an externally connected circuit, and therefore the inductor 11 is formed outside the region in which the transistors 10 and 20 are formed. Thus, the resistive element is arranged in a region outside the transistors 10 and 20 and a matching network formed of the inductor 11 and the capacitor 15, and therefore does not affect the gain of an amplifier formed by the transistors 10 and 20.

FIG. 10A is a diagram illustrating a circuit state when the amplification circuit 2 according to embodiment 2 is operating. FIG. 10B is a diagram illustrating a circuit state when the amplification circuit 2 according to embodiment 2 is not operating. As illustrated in FIGS. 10A and 10B, the switch 14 is serially arranged on the first path that connects the drain terminal D2 and the power supply terminal 53 to each other. In addition, due to a wiring line or the like used to connect the power supply terminal 53 to the power supply 31, a parasitic inductance $L_{G2}$ is generated at the gate terminal G2 with the power supply terminal 53 and the capacitor 12 interposed between the parasitic inductance $L_{G2}$ and the gate terminal G2.

With respect to this, as illustrated in FIG. 10A, when a high-frequency signal (RFin) is inputted and the amplification circuit 2 performs an amplification operation, the switch 14 is in a conductive state. On the other hand, as illustrated in FIG. 10B, when the amplification circuit 2 is not performing an amplification operation, the switch 14 is in a non-conductive state.

When an amplification operation is performed, the switch 14 has an on resistance when in a conductive state, and therefore the feedback circuit forms a loop that does not have a loop gain that is greater than or equal to 1 (feedback signal is attenuated) due to the on resistance. Thus, even when the parasitic inductance component $L_{G2}$ is generated at the gate terminal G2, a feedback signal between the drain terminal D2 and the gate terminal G2 is attenuated by this loop, and therefore the stable amplification circuit 2 in which oscillation is prevented can be provided.

On the other hand, when an amplification operation is not being performed, the switch 14 is in a non-conductive state, and a so-called off leakage current that flows from the power supply terminal 53 to the ground terminal 55 via the drain terminal D2, the source terminal S2, the drain terminal D1, and the source terminal S1 can be suppressed.

In other words, in the amplification circuit 2 in which the switch 14 is serially arranged on the first path, oscillation can be suppressed in the amplification circuit 2 when the amplification circuit 2 is performing an amplification operation, and the off leakage current of the amplification circuit 2 can be suppressed when the amplification circuit 2 is not performing an amplification operation.

As the frequency becomes higher, the impedance ($j\omega L_{G2}$) of the parasitic inductance $L_{G2}$ increases and feedback via the gate becomes more likely to occur. In general, in the case where a high-performance transistor having a gain of up to several tens of GHz is used, there is a possibility that the loop gain of a loop formed by this feedback will be greater than or equal to 1. In addition, the off leakage current tends to increase if the performance of the transistor that higher.

With respect to this, the amplification circuit 2 according to this embodiment is characterized in that, even when the amplification performances of the transistors 10 and 20 are high, a feedback circuit can be formed in which a feedback signal is attenuated and in that the off leakage current can be suppressed.

The amplification circuit 2 according to this embodiment may include a second resistive element, which is a second resistor or a second switch, that is serially arranged on only the second path out of the first path and the second path. Thus, even in the case where the necessary resistance value is not secured with only the on resistance of a first switch when the first switch is in a conductive state, sufficient loop attenuation can be realized using a second resistive element while fixing the potential of the gate terminal G2.

2.2 Stability Factor of Amplification Circuit

Figure 11:
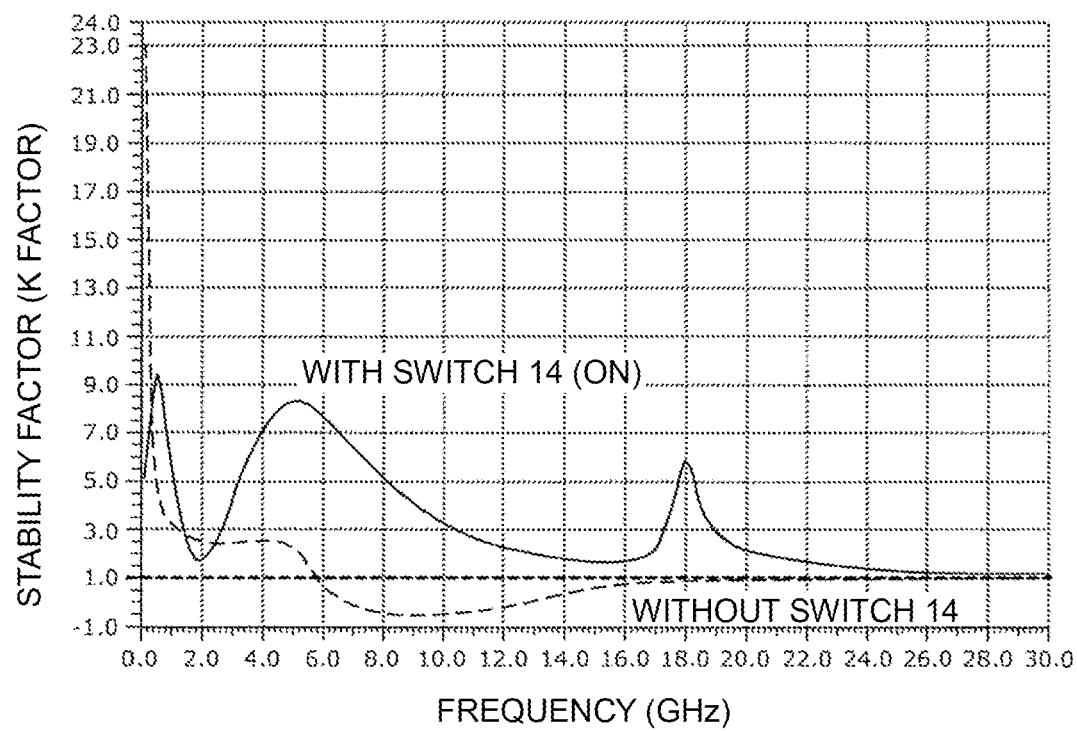
FIG. 11 is a graph illustrating a stability factor of the amplification circuit according to embodiment 2.

FIG. 11 is a graph illustrating the stability factor of the amplification circuit 2 according to embodiment 2. In the figure, the frequency characteristics of the stability factors (K factors) of the amplification circuit 2 according to embodiment 2 (includes switch 14 (on)) and an amplification circuit according to a comparative example (does not include switch 14) are illustrated. The configuration of the amplification circuit according to the comparative example differs from the configuration of the amplification circuit 2 according to embodiment 2 only in that the switch 14 is not arranged.

As illustrated in the figure, in the amplification circuit according to the comparative example, when the parasitic inductance $L_{G2}$ is generated at the gate terminal G2, there is a frequency band in which the stability factor (K factor) is smaller than 1 in a high-frequency band (~30 GHz) when an amplification operation is being performed, and therefore there is a high probability that an oscillation will undesirably occur in the high-frequency band.

In contrast, in the amplification circuit 2 according to this embodiment, even when the parasitic inductance $L_{G2}$ is generated at the gate terminal G2, the stability factor (K factor) in a high-frequency band (~30 GHz) can be made to be greater than or equal to 1 when an amplification operation is being performed, and therefore a stable amplification operation in which oscillation is prevented can be provided.

Other Embodiments, Etc.

Amplification circuits according to embodiments of the present disclosure have been described above in the form of embodiments 1 and 2, but an amplification circuit of the present disclosure is not limited to the above-described embodiments. Other embodiments realized by combining any of the constituent elements of the above-described embodiments, modifications obtained by modifying the above-described embodiments in various ways, as thought of by one skilled in the art, while not departing from the gist of the present disclosure, and various devices that have an amplification circuit of the present disclosure built thereinto are included in the scope of the present disclosure.

For example, an amplification circuit obtained by adding the resistor 17 (second resistor serially arranged on first path) according to modification 2 of embodiment 1 or the resistor 18 (third resistor connected in parallel with inductor 11) according to modification 3 of embodiment 1 to the amplification circuit 2 according to embodiment 2 is also included in the scope of the present disclosure.

In addition, although a switch or a resistor is described as the first resistive element in embodiment 1 and embodiment 2, the first resistive element is not limited to these examples and it is sufficient that the first resistive element be an element that has a resistance component and causes the energy of a high-frequency signal to be attenuated. Specifically, other than a switch or a resistor, a wiring line having a parasitic resistance, an inductance element having a Q value that is not that high, a capacitance element having a Q value that is not that high, and so forth may be used as the first resistive element. For example, in the case where a capacitance element having a low Q value is used as the capacitor 13 in embodiment 1, the capacitor 13 can be used as the "first resistive element", and therefore the switch 14 can be omitted.

In addition, in the amplification circuits according to the embodiments described above, other high-frequency circuit elements, wiring lines, and so forth may be inserted between paths that connect circuit elements and signal paths disclosed in the drawings.

The present disclosure can widely be used in communication devices as a cascode-connection-type amplification circuit that amplifies a high-frequency signal.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An amplification circuit comprising:
   an input terminal to which a high frequency signal is inputted;
   an output terminal that outputs an amplified high frequency signal;
   a power supply terminal that is connected to a power supply;
   a first transistor that has a first terminal, a second terminal, and a first control terminal, wherein the high frequency signal is inputted to the first control terminal via the input terminal;
   a second transistor that has a third terminal connected to the second terminal, a fourth terminal configured to output the amplified high frequency signal, and a second control terminal that is grounded, the second transistor being cascode-connected to the first transistor;
   a first capacitance element that is serially connected in a second path, the second path connecting the second control terminal and the power supply terminal;
   a first resistive element that is serially connected in a first path, the first path connecting the fourth terminal and the power supply terminal; and
   a first inductance element that is serially connected in the first path, wherein:
   the fourth terminal and the second control terminal are connected to each other via the first resistive element and the first capacitance element,
   the first resistive element is serially connected in the first path between the first inductance element and the first capacitance element, and
   the first transistor and the second transistor are field effect transistors.

2. The amplification circuit according to claim 1, further comprising:
   a second capacitance element that is serially connected between the fourth terminal and the output terminal.

3. The amplification circuit according to claim 1, wherein:
   the first resistive element is a first switch, and
   the first switch is serially connected in the first path.

4. The amplification circuit according to claim 2, wherein:
   the first resistive element is a first switch, and
   the first switch is serially connected in the first path.

5. The amplification circuit according to claim 3, wherein:
   when the amplification circuit is performing an amplification operation, the first switch is in a conductive state, and when the amplification circuit is not performing an amplification operation, the first switch is in a non-conductive state.

6. The amplification circuit according to claim 4, wherein:
when the amplification circuit is performing an amplification operation, the first switch is in a conductive state, and
when the amplification circuit is not performing an amplification operation, the first switch is in a non-conductive state.

7. The amplification circuit according to claim 3, further comprising:
a second resistive element that is serially connected in the first path or the second path, wherein the second resistive element is a second resistor or a second switch.

8. The amplification circuit according to claim 5, further comprising:
a second resistive element that is serially connected in the first path or the second path, wherein the second resistive element is a second resistor or a second switch.

9. The amplification circuit according to claim 2, further comprising:
a third resistive element that is connected in parallel with the first inductance element.

10. The amplification circuit according to claim 1, wherein the power supply is configured to generate a direct-current power supply voltage.

11. An amplification circuit comprising:
an input terminal to which a high frequency signal is inputted;
an output terminal that outputs an amplified high frequency signal;
a power supply terminal that is connected to a power supply;
a first transistor that has a first terminal, a second terminal, and a first control terminal, wherein the high frequency signal is inputted to the first control terminal;
a second transistor that has a third terminal connected to the second terminal, a fourth terminal configured to output the amplified high frequency signal, and a second control terminal, the second transistor being cascode-connected to the first transistor;
a first capacitance element that is serially connected in a second path, the second path connecting the second control terminal and the power supply terminal;
a first resistive element that is serially connected in a first path, the first path connecting the fourth terminal and the power supply terminal; and
a first inductance element that is serially connected in the first path, wherein:

the fourth terminal and the second control terminal are connected to each other via the first resistive element,
the first resistive element is serially connected in the first path between the first inductance element and the first capacitance element,
a path between the first resistive element and the first capacitance element is not connected to a ground potential, and
the first transistor and the second transistor are field effect transistors.

12. The amplification circuit according to claim 11, further comprising:
a second capacitance element that is serially connected between the fourth terminal and the output terminal.

13. The amplification circuit according to claim 11, wherein:
the first resistive element is a first switch, and
the first switch is serially connected in the first path.

14. The amplification circuit according to claim 12, wherein:
the first resistive element is a first switch, and
the first switch is serially connected in the first path.

15. The amplification circuit according to claim 13, wherein:
when the amplification circuit is performing an amplification operation, the first switch is in a conductive state, and
when the amplification circuit is not performing an amplification operation, the first switch is in a non-conductive state.

16. The amplification circuit according to claim 13, further comprising:
a second resistive element that is serially connected in the second path, the second path connecting the second control terminal and the power supply terminal, wherein the second resistive element is a second resistor or a second switch.

17. The amplification circuit according to claim 15, further comprising:
a second resistive element that is serially connected in the second path, the second path connecting the second control terminal and the power supply terminal, wherein the second resistive element is a second resistor or a second switch.

18. The amplification circuit according to claim 12, further comprising:
a third resistive element that is connected in parallel with the first inductance element.

19. The amplification circuit according to claim 11, wherein the power supply is configured to generate a direct-current power supply voltage.

* * * * *